United States Patent
Yang

(10) Patent No.: US 11,963,393 B2
(45) Date of Patent: Apr. 16, 2024

(54) DISPLAY PANEL INCLUDING PHASE RETARDATION AND LINEAR POLARIZING LAYERS

(71) Applicant: Wuhan China Star Optoelectronics Semiconductor Display Technology Co., Ltd., Wuhan (CN)

(72) Inventor: Hanning Yang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/979,883

(22) PCT Filed: Jun. 12, 2020

(86) PCT No.: PCT/CN2020/095780
§ 371 (c)(1),
(2) Date: Sep. 11, 2020

(87) PCT Pub. No.: WO2021/217800
PCT Pub. Date: Nov. 4, 2021

(65) Prior Publication Data
US 2023/0096606 A1 Mar. 30, 2023

(30) Foreign Application Priority Data
Apr. 30, 2020 (CN) .......................... 202010364425.6

(51) Int. Cl.
*H10K 50/84* (2023.01)
*G02B 5/30* (2006.01)
(Continued)

(52) U.S. Cl.
CPC .......... *H10K 50/86* (2023.02); *G02B 5/3016* (2013.01); *H10K 50/844* (2023.02);
(Continued)

(58) Field of Classification Search
CPC .... H10K 50/86; H10K 50/844; H10K 50/868; H10K 77/10; H10K 77/111;
(Continued)

(56) References Cited

U.S. PATENT DOCUMENTS

| 10,930,892 B1 | 2/2021 | Weng et al. |
| 2004/0218390 A1* | 11/2004 | Holman ................. H04N 9/315 |
| | | 257/E33.072 |

(Continued)

FOREIGN PATENT DOCUMENTS

| CN | 104576684 A | 4/2015 |
| CN | 109065579 A | 12/2018 |

(Continued)

*Primary Examiner* — Ida M Soward
(74) *Attorney, Agent, or Firm* — Menachem Nathan; Nathan & Associates

(57) ABSTRACT

A display panel is provided. The display panel includes a substrate, a thin film transistor array layer disposed on the substrate, a light emitting device layer disposed on the thin film transistor array layer, a thin film encapsulation layer disposed on the light emitting device layer, a phase retardation layer disposed within the thin film encapsulation layer, and a linear polarizing layer disposed within the thin film encapsulation layer. By removing a conventional polarizer, a problem in a conventional display panel that disposition of a polarizer limits a thickness of the entire display panel and reduces bending performance of the display panel is solved.

18 Claims, 2 Drawing Sheets

(51) Int. Cl.
  *H10K 50/844* (2023.01)
  *H10K 50/86* (2023.01)
  *G02F 1/1335* (2006.01)
  *G02F 1/1362* (2006.01)
  *H10K 50/80* (2023.01)
  *H10K 77/10* (2023.01)
  *H10K 102/00* (2023.01)

(52) U.S. Cl.
  CPC ...... *G02B 5/3083* (2013.01); *G02F 1/133512* (2013.01); *G02F 1/136209* (2013.01); *H10K 50/868* (2023.02); *H10K 77/10* (2023.02); *H10K 77/111* (2023.02); *H10K 2102/311* (2023.02); *H10K 2102/351* (2023.02)

(58) Field of Classification Search
  CPC ........ H10K 2102/311; H10K 2102/351; G02F 1/136209; G02F 1/133512; G02B 5/30116

See application file for complete search history.

(56) References Cited

U.S. PATENT DOCUMENTS

| | | | |
|---|---|---|---|
| 2005/0036089 A1* | 2/2005 | Lyu | G02F 1/13363 349/117 |
| 2009/0219472 A1* | 9/2009 | Fujita | G02F 1/13363 349/114 |
| 2015/0115235 A1 | 4/2015 | Lee et al. | |
| 2016/0266296 A1* | 9/2016 | Son | H10K 50/86 |
| 2016/0293895 A1 | 10/2016 | Kim | |
| 2017/0358637 A1* | 12/2017 | Lee | H10K 59/1213 |
| 2018/0053918 A1* | 2/2018 | Woo | H10K 59/38 |
| 2019/0113799 A1* | 4/2019 | Shin | G02F 1/1337 |
| 2019/0181189 A1* | 6/2019 | Chang | H10K 50/865 |
| 2020/0161586 A1* | 5/2020 | Lee | H10K 50/86 |

FOREIGN PATENT DOCUMENTS

| | | | | |
|---|---|---|---|---|
| CN | 110289368 A | | 9/2019 | |
| CN | 110600514 A | | 12/2019 | |
| CN | 111081747 A | | 4/2020 | |
| KR | 20100063292 A | * | 6/2010 | ......... H10N 60/0436 |
| KR | 20110059304 A | * | 6/2011 | ........... H10K 85/621 |
| KR | 20120130473 A | * | 12/2012 | ............. H05B 33/22 |
| KR | 20190078224 A | | 7/2019 | |

* cited by examiner

DISPLAY PANEL INCLUDING PHASE RETARDATION AND LINEAR POLARIZING LAYERS

FIELD OF INVENTION

The present disclosure relates to the field of display technology, and particularly, to a display panel.

BACKGROUND OF INVENTION

With development of technology and increase of people's requirement for products, flexible display screens have become a field that attracts much attention. Currently, reducing a thickness of the screen to achieve a foldable screen has become a development trend of future mobile screens. For conventional organic light-emitting diode (OLED) display screens, a polarizer of the OLED display screen is composed of a λ/4 phase retardation sheet and a linear polarizer, and the polarizer may effectively eliminate reflected light caused by external light irradiating a surface of the display screen. However, a thickness of the conventional polarizer is generally less than 100 μm, thereby limiting the thickness of the screen and reducing bending performance of the screen.

Therefore, conventional technology has defects and requires to be solved urgently.

SUMMARY OF INVENTION

Technical Problem

The present disclosure provides a display panel to solve a problem in conventional display panels that disposition of a polarizer limits a thickness of the entire display panel and reduces bending performance of the display panel.

Technical Solutions

In order to solve the above-mentioned problem, the present disclosure provides technical solutions as follows:
The present disclosure provides a display panel including:
a substrate;
a thin film transistor array layer disposed on the substrate;
a light emitting device layer disposed on the thin film transistor array layer;
a thin film encapsulation layer disposed on the light emitting device layer;
a phase retardation layer disposed within the thin film encapsulation layer; and
a linear polarizing layer disposed within the thin film encapsulation layer.

In the display panel of the present disclosure, the thin film encapsulation layer includes inorganic layers and an organic layer which are mutually stacked, and the phase retardation layer and the linear polarizing layer are located between the inorganic layer and the organic layer which are adjacent to each other, or the inorganic layer and/or the organic layer are disposed between the phase retardation layer and the linear polarizing layer.

In the display panel of the present disclosure, the linear polarizing layer is located on a side of the phase retardation layer away from the light emitting device layer.

In the display panel of the present disclosure, the light-emitting layer includes light emitting devices distributed in an array, the phase retardation layer includes phase retardation units corresponding to the light emitting devices and distributed in an array, and the display panel is provided with black barrier walls corresponding to gaps between the two adjacent phase retardation units.

In the display panel of the present disclosure, the thin film transistor array layer includes an inorganic stacked layer and thin film transistors, the display panel is further provided with an organic stacked layer on the inorganic stacked layer, and the black barrier walls are located on the organic stacked layer or within the thin film encapsulation layer.

In the display panel of the present disclosure, the linear polarizing layer includes linear polarizing units corresponding to the phase retardation units and distributed in an array, and orthographic projections of the linear polarizing units projected on the substrate cover orthographic projections of the phase retardation units projected on the substrate.

In the display panel of the present disclosure, the phase retardation units cover a light emitting area of the light emitting device layer.

In the display panel of the present disclosure, the phase retardation layer is made of an anisotropic organic material.

In the display panel of the present disclosure, the phase retardation layer is made of a liquid crystal material, and alignment layers are disposed on a surface of the phase retardation layer.

In the display panel of the present disclosure, a phase difference of the phase retardation layer is a quarter wavelength.

In order to solve the above-mentioned problem, the present disclosure further provides a display panel including:
a substrate;
a thin film transistor array layer disposed on the substrate;
a light emitting device layer disposed on the thin film transistor array layer;
a thin film encapsulation layer disposed on the light emitting device layer;
a phase retardation layer disposed within the thin film encapsulation layer; and
a linear polarizing layer disposed within the thin film encapsulation layer, wherein the phase retardation layer and the linear polarizing layer are mutually stacked.

In the display panel of the present disclosure, the thin film encapsulation layer includes inorganic layers and an organic layer which are mutually stacked, and the phase retardation layer and the linear polarizing layer are located between the inorganic layer and the organic layer which are adjacent to each other, or the inorganic layer and/or the organic layer are disposed between the phase retardation layer and the linear polarizing layer.

In the display panel of the present disclosure, the linear polarizing layer is located on a side of the phase retardation layer away from the light emitting device layer.

In the display panel of the present disclosure, the light-emitting layer includes light emitting devices distributed in an array, the phase retardation layer includes phase retardation units corresponding to the light emitting devices and distributed in an array, and the display panel is provided with black barrier walls corresponding to gaps between the two adjacent phase retardation units.

In the display panel of the present disclosure, the thin film transistor array layer includes an inorganic stacked layer and thin film transistors, the display panel is further provided with an organic stacked layer on the inorganic stacked layer, and the black barrier walls are located on the organic stacked layer or within the thin film encapsulation layer.

In the display panel of the present disclosure, the linear polarizing layer includes linear polarizing units corresponding to the phase retardation units and distributed in an array, and orthographic projections of the linear polarizing units projected on the substrate cover orthographic projections of the phase retardation units projected on the substrate.

In the display panel of the present disclosure, the phase retardation units cover a light emitting area of the light emitting device layer.

In the display panel of the present disclosure, the phase retardation layer is made of an anisotropic organic material.

In the display panel of the present disclosure, the phase retardation layer is made of a liquid crystal material, and alignment layers are disposed on a surface of the phase retardation layer.

In the display panel of the present disclosure, a phase difference of the phase retardation layer is a quarter wavelength.

Advantageous Effects

The advantageous effects of the present disclosure are that in comparison with the conventional display panels attached with the polarizers, a thickness of the display panel provides by the present disclosure is greatly reduced by removing the conventional polarizer and disposing the phase retardation layer and the linear polarizing layer within the thin film encapsulation layer, thus improving the bending performance of the display panel. Moreover, the combination of the phase retardation layer and the linear polarizing layer may effectively eliminate reflected light caused by external light irradiating a surface of the display panel.

DESCRIPTION OF DRAWINGS

By illustrating specific implementations of the present disclosure in conjunction with accompanying drawings in detail below, technical solutions and other advantageous effects are obvious.

DETAILED DESCRIPTION OF PREFERRED EMBODIMENTS

Figure 1:
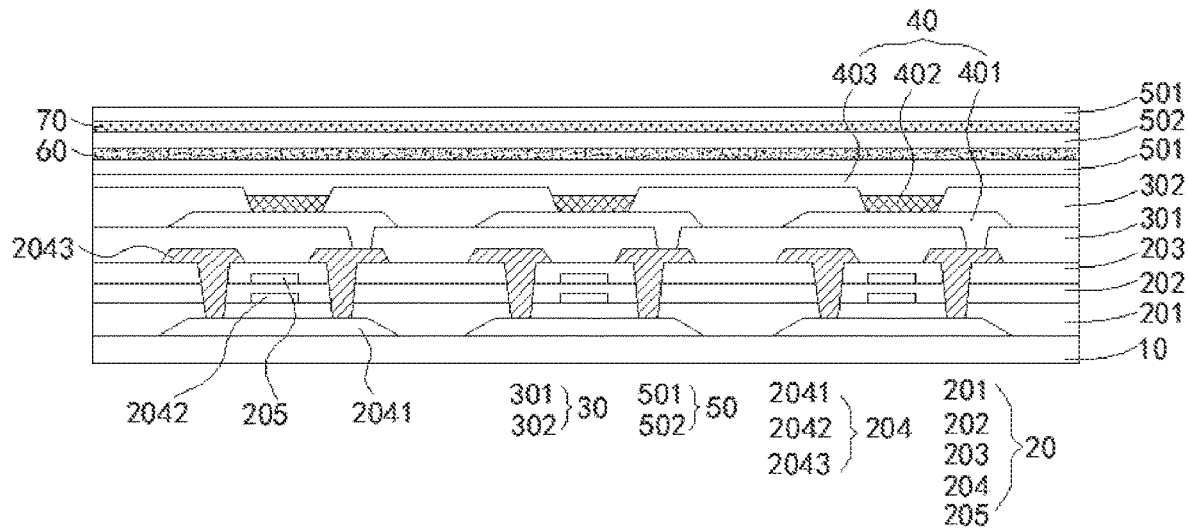
FIG. 1 is a structural schematic view of a display panel provided by a first embodiment of the present disclosure.

In combination with accompanying drawings in embodiments of the present disclosure below, technical solutions in the embodiments of the present disclosure are clearly and completely described. Obviously, the described embodiments are merely a part of the embodiments of the present disclosure, rather than all the embodiments. Based on the embodiments in the present disclosure, all of other embodiments obtained by those skilled in the art without making for creative efforts belong to the scope protected by the present disclosure.

In the description of the present disclosure, it should be illustrated and understood that indicative directions or position relations, such as terms "upper", "lower", "front", "back", "inner", and "outer", are based on directions or position relations indicated by the accompanying drawings. The indicative directions or position relations are only for convenience of describing the present disclosure and simplifying the description, and do not indicate or imply that indicated devices or elements must have a specific orientation and be constructed and operated in a specific orientation. Therefore, the indicative directions or position relations cannot be understood to be limitation to the present disclosure.

In the description of the present disclosure, it should be understood that indicative directions or position relations, such as terms "longitudinal", "transverse", "length", "width", "upper", "lower", "front", "back", "left", "right", "vertical", and "horizontal", are based on directions or position relations indicated by the accompanying drawings. The indicative directions or position relations are only for convenience of describing the present disclosure and simplifying the description, and do not indicate or imply that indicated devices or elements must have a specific orientation and be constructed and operated in a specific orientation. Therefore, the indicative directions or position relations cannot be understood to be limitation to the present disclosure. In addition, terms, such as "first" and "second", are only used for purposes of description, and do not be understood to indicate or imply relative importance or to imply numbers of indicated technical features. Thus, the features defined with "first" and "second" may explicitly or implicitly include one or more of the features. In the description of the present disclosure, term "a plurality of" means two or more than two, unless specified otherwise. In the present disclosure, "/" means "or".

Reference numerals and/or reference letters may be repeated in different examples in the present disclosure. This repeating is for the purposes of simplification and clarity, and does not refer to relations between various embodiments and/or settings.

Figure 4:
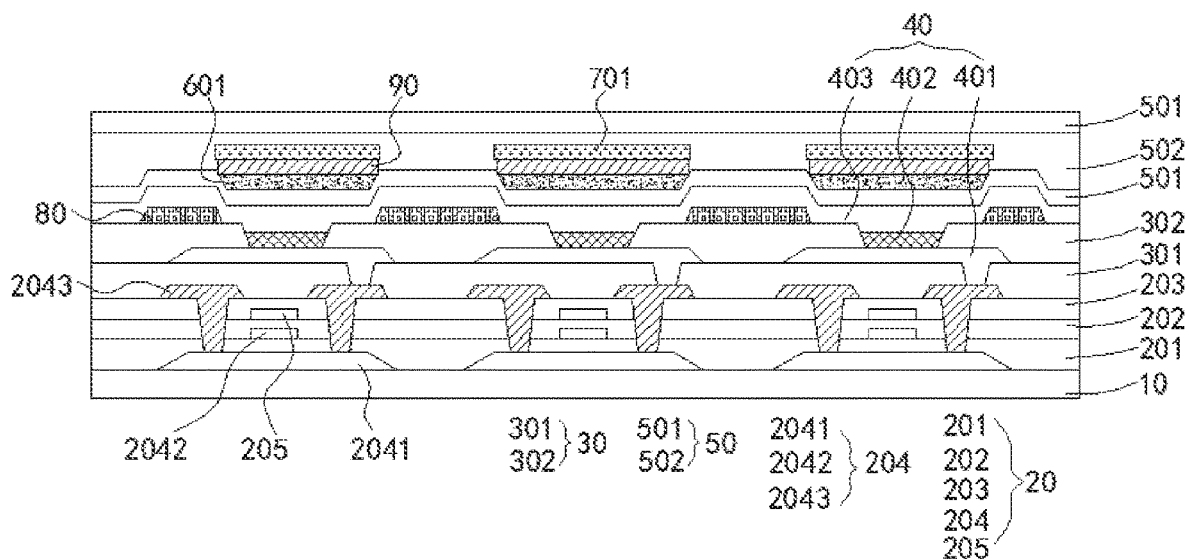
FIG. 4 is a structural schematic view of a display panel provided by a fourth embodiment of the present disclosure.

Referring to FIG. 1 and FIG. 4, the present disclosure provides a display panel including a substrate 10 which may be a flexible substrate, but not limited to the flexible substrate, a thin film transistor array layer 20 disposed on the substrate 10, a light emitting device layer 40 disposed on the thin film transistor array layer 20, a thin film encapsulation layer 50 disposed on the light emitting device layer 40, a phase retardation layer 60 disposed within the thin film encapsulation layer 50, and a linear polarizing layer 70 disposed within the thin film encapsulation layer 50, wherein the phase retardation layer 60 and the linear polarizing layer 70 are mutually stacked.

The conventional organic light-emitting diode (OLED) display panels usually employ external polarizers. The polarizer generally is a composite film composed of a plurality of organic material layers including the λ/4 phase retardation layer and the linear polarizing layer, and these two birefringent layers may achieve an anti-reflection function of the screen. However, a plurality of thin films are required to protect and connect the λ/4 phase retardation layer with the linear polarizing layer, thus resulting in the polarizer with a great thickness. The thickness of the conventional polarizer is generally less than 100 μm, thereby limiting a thickness of the screen and reducing bending performance of the screen.

In the display panel of the present disclosure, by removing the conventional polarizer and only disposing the phase retardation layer and the linear polarizing layer within the thin film encapsulation layer, the combination of the phase retardation layer and the linear polarizing layer may effectively eliminate reflected light caused by external light irradiating a surface of the display panel. In comparison with the conventional display panels attached with the polarizers, a thickness of the display panel of the present disclosure is greatly reduced, thereby improving the bending performance of the display panel and facilitating the development of the foldable display panels.

In combination with the specific embodiments, the display panel described by the present disclosure is illustrated in detail below.

A First Embodiment

Referring to FIG. 1, FIG. 1 is a structural schematic view of a display panel provided by the first embodiment of the present disclosure. The thin film transistor array layer 20 is disposed on the substrate 10 and includes an inorganic stacked layer and thin film transistors 204. Specifically, the inorganic stacked layer includes, but is not limited to, a first gate insulation layer 201, a second gate insulation layer 202, and an interlayer insulation layer 203 which are mutually stacked. The thin film transistor 204 includes an active layer 2041, a gate electrode 2042, and a source/drain electrode 2043. An electrode layer 205 is disposed on the gate electrode 2042 and is insulated from the gate electrode 2042, and the electrode layer 205 and the gate electrode 2042 form an electric capacity.

An organic stacked layer 30 and the light emitting device layer 40 are also disposed on the inorganic stacked layer, and the organic stacked layer 30 includes, but is not limited to, a planarization layer 301 and a pixel definition layer 302 which are mutually stacked. The light emitting device layer 40 includes anodes 401, light emitting layers 402, a cathode 403 which are mutually stacked.

The anodes 401 are disposed on the planarization layer 301, and are electrically connected to the source/drain electrodes 2043 of the thin film transistors 204 via through holes on the planarization layer 301. Pixel holes are formed on sites of the pixel definition layer 302 corresponding to the anodes 401, the light emitting layers 402 are located within the pixel holes, and the cathode 403 is disposed on the light emitting layers 402.

The thin film encapsulation layer 50 is disposed on the cathode 403, and at least includes three laminated layers which are an inorganic layer 501, an organic layer 502, and an inorganic layer 501. A thickness of the inorganic layer is generally in a range of several hundred nanometers, and a thickness of the organic layer 502 is generally less than 20 µm. The organic layer 502 may not only be used to block water and oxygen but also function as a flat surface.

In order to reduce the thickness of the entire module of the display screen, the external polarizer is integrated into the thin film encapsulation layer 50 of the display panel in the present disclosure. The thin film encapsulation layer 50 includes the phase retardation layer 60 and the linear polarizing layer 70, and the linear polarizing layer 70 is located on a side of the phase retardation layer 60 away from the light emitting device layer 40.

In the embodiment, the whole phase retardation layer 60 and the whole linear polarizing layer 70 are disposed within the thin film encapsulation layer 50. Specifically, the inorganic layer 501 and/or the organic layer 502 are disposed between the phase retardation layer 60 and the linear polarizing layer 70, or the phase retardation layer 60 and the linear polarizing layer 70 are located between the inorganic layer and the organic layer which are adjacent to each other.

In FIG. 1, the phase retardation layer 60 is located on a first inorganic layer 501, the organic layer 502 is disposed on the phase retardation layer 60, the linear polarizing layer 70 is disposed on the organic layer 502, and a second inorganic layer 501 is disposed on the linear polarizing layer 70.

In the embodiment, a phase difference of the phase retardation layer 60 is a quarter wavelength, and the phase retardation layer 60 may be a quarter wave plate.

In the display panel of the embodiment, when the external incident light or nature light irradiates the surface of the display panel, the external incident light or nature light passes through the linear polarizing layer 70 to be converted into linearly polarized light, such as the linearly polarized light in a horizontal direction, the linearly polarized light passed through the phase retardation layer 60 to be converted into circularly polarized light, and the circularly polarized light is reflected by the cathode 403 and the anodes 401, thus increasing the phase difference of $\pi$. For example, left-handed circularly polarized light is converted into right-handed circularly polarized light, or the right-handed circularly polarized light is converted into the left-handed circularly polarized light. The circularly polarized light with the phase retardation passes through the phase retardation layer 60 again to be converted into the linearly polarized light perpendicular to the incident linearly polarized light, such as the linearly polarized light in a vertical direction, so that the linearly polarized light in the vertical direction cannot pass through the linear polarizing layer 70, thus achieving the elimination of the light.

Since the quarter wave plate of the conventional polarizer is mainly obtained by stretching polymer material, a thickness of the quarter wave plate generally requires to be several ten microns to reach a specific coefficient of the phase retardation. However, in the present disclosure, the phase retardation layer 60 may be made of a liquid crystal material or other anisotropic organic materials, and a thickness of the phase retardation layer 60 is in a range of one to several microns, thereby greatly reducing the thickness and improving the bending performance of the display panel.

A Second Embodiment

Figure 2:
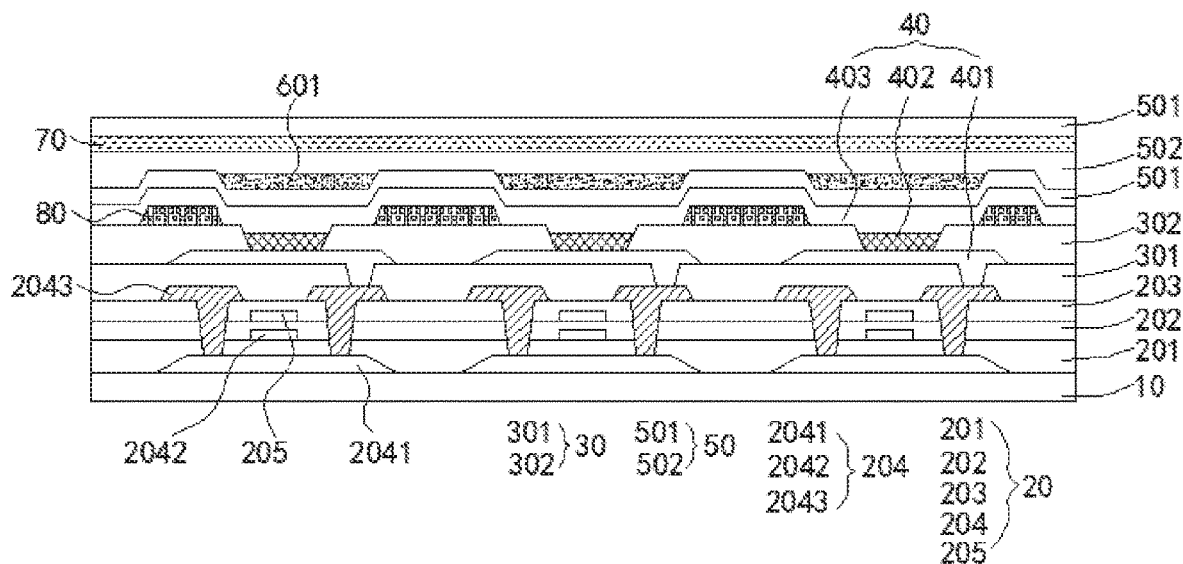
FIG. 2 is a structural schematic view of a display panel provided by a second embodiment of the present disclosure.

As shown in FIG. 2, FIG. 2 is a structural schematic view of a display panel provided by the second embodiment of the present disclosure. The display panel of this embodiment is the same as/similar to the display panel of the above-mentioned first embodiment, and the difference is that the light emitting device layer 40 includes light emitting devices, i.e., pixels, distributed in an array, the phase retardation layer includes phase retardation units 601 corresponding to the light emitting devices and distributed in an array, and the display panel is provided with black barrier walls 80 corresponding to gaps between the two adjacent phase retardation units 601. The black barrier walls 80 are made of a light absorbing material, and may effectively absorb the external incident light outside the phase retardation units 601. Therefore, the reflected light caused by the external light irradiating the surface of the display panel may be further eliminated.

The black barrier walls 80 are located on the organic stacked layer 30 or within the thin film encapsulation layer 50, and a height of the black barrier walls 80 is in a range of several microns to several ten microns.

Specifically, the black barrier walls 80 are located on the pixel definition layer 302, and may be configured to surround the pixel holes. Because of disposing the black barrier walls 80, the cathode 403 and the inorganic layer 501 located on the black barrier walls 80 may form recesses at sites corresponding to the pixel holes, and the phase retardation units 601 correspond to the recesses.

The phase retardation units 601 cover a light emitting area of the light emitting device layer 40, and that is, orthographic projections of the phase retardation units 601 projected on the substrate 10 cover orthographic projections of the light emitting layers 402 projected on the substrate 10. The phase retardation units 601 may extend toward periphery of the pixel holes.

In an embodiment, the black barrier walls 80 may be located on the inorganic layer 501 or the organic layer 502 of the thin film encapsulation layer 50, and the external incident light outside the phase retardation units 601 may be absorbed by the black barrier walls 80.

Specifically, the black barrier walls 80 and the phase retardation units 601 may be located on the same layer, and the adjacent phase retardation units 601 may be separated by the black barrier wall 80.

The anti-reflection (the elimination of the light) principle of the phase retardation units 601 and the linear polarizing layer 70 in this embodiment is the same as the anti-reflection principle of the above-mentioned first embodiment, and thus is not redundantly described in detail herein.

A Third Embodiment

Figure 3:
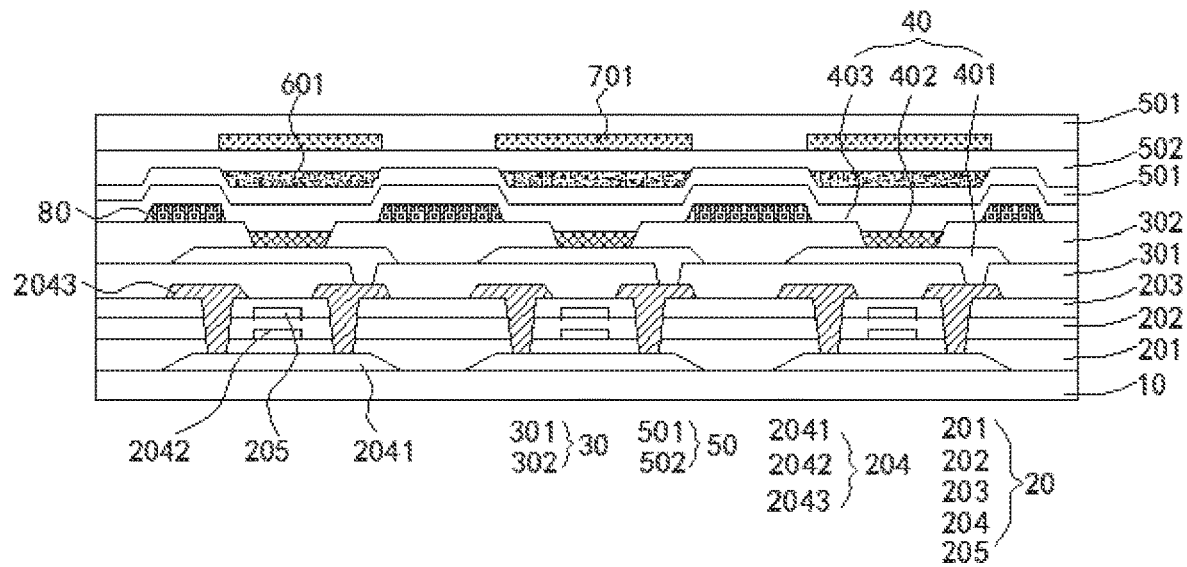
FIG. 3 is a structural schematic view of a display panel provided by a third embodiment of the present disclosure.

As shown in FIG. 3, FIG. 3 is a structural schematic view of a display panel provided by the third embodiment of the present disclosure. The display panel of this embodiment is the same as/similar to the display panel of the above-mentioned second embodiment, and the difference is that the linear polarizing layer described by this embodiment includes linear polarizing units 701 corresponding to the phase retardation units 601 and distributed in an array, and orthographic projections of the linear polarizing units 701 projected on the substrate 10 cover the orthographic projections of the phase retardation units 601 projected on the substrate 10.

The advantageous effects of this embodiment are the same as the advantageous effects of the above-mentioned second embodiment, and the anti-reflection (the elimination of the light) principle of the phase retardation units 601 and the linear polarizing units 701 in this embodiment is the same as the anti-reflection principle of the above-mentioned first embodiment, and thus is not redundantly described in detail herein.

A Fourth Embodiment

As shown in FIG. 4, FIG. 4 is a structural schematic view of a display panel provided by the fourth embodiment of the present disclosure. The display panel of this embodiment is the same as/similar to the display panel of the above-mentioned third embodiment, and the difference is that the phase retardation units 601 and the linear polarizing units 701 in this embodiment are located between the inorganic layer 501 and the organic layer 502 which are adjacent to each other, the phase retardation layer (the phase retardation units 601) is made of the liquid crystal material, and alignment layers 90 are disposed on a surface of the phase retardation layer.

The alignment layer 90 may be located on a side of the phase retardation unit 601 away from the linear polarizing unit 701 or on a side of the phase retardation unit 601 facing the linear polarizing unit 701, or the alignment layer 90 may be disposed on both sides of the phase retardation unit 601.

In an embodiment, a size of the alignment layers 90 may be adapted to a size of the phase retardation layer. The alignment layers 90 may be configured to be a whole layer, or may be distributed in an array. Certainly, the phase retardation unit 601 and the linear polarizing unit 701 may be located on different film layers of the thin film encapsulation layer.

The alignment layers 90 are used to align the liquid crystal material, thus causing a proper phase difference of the liquid crystal material, such as the phase difference of the quarter wavelength. Certainly, the liquid crystal material may be aligned according to actual requirements.

In comparison with the above-mentioned third embodiment, the alignment layers 90 are disposed, so that the phase retardation units 601 causes different phase differences in this embodiment. The reflected light may be flexibly eliminated according to actual conditions.

The anti-reflection (the elimination of the light) principle of the phase retardation units 601 and the linear polarizing units 701 in this embodiment is the same as the anti-reflection principle of the above-mentioned first embodiment, thus redundantly described in detail herein.

In comparison with the conventional display panels attached with the polarizers, the thickness of the display panel provides by the present disclosure is greatly reduced by removing the conventional polarizer and disposing the phase retardation layer and the linear polarizing layer within the thin film encapsulation layer, thus improving the bending performance of the display panel. Moreover, the combination of the phase retardation layer and the linear polarizing layer may effectively eliminate the reflected light caused by the external light irradiating the surface of the display panel. Additionally, the reflected light caused by the external light irradiating the surface of the display panel may further be eliminated by disposing the black barrier walls with the light absorption function.

In summary, although the present disclosure has been disclosed by above preferred embodiments, the above preferred embodiments do not intend to limit the present disclosure, and those skilled in the art may make various changes and modifications without departing from the spirit and the scope of the present disclosure. Therefore, the protection scope of the present disclosure is defined by the scope of the claims.

What is claimed is:

1. A display panel, comprising:
a substrate;
a thin film transistor array layer, disposed on the substrate;
a light emitting device layer, disposed on the thin film transistor array layer and comprising light emitting devices distributed in an array;
a thin film encapsulation layer, disposed on the light emitting device layer;
a phase retardation layer, disposed within the thin film encapsulation layer, and comprising phase retardation units corresponding to the light emitting devices and distributed in an array; and
a linear polarizing layer disposed within the thin film encapsulation layer,
wherein the display panel is provided with black barrier walls corresponding to gaps between the two adjacent phase retardation units.

2. The display panel according to claim 1, wherein the thin film encapsulation layer comprises inorganic layers and an organic layer which are mutually stacked, and the phase retardation layer and the linear polarizing layer are located between the inorganic layer and the organic layer which are adjacent to each other, or the inorganic layer and/or the organic layer are disposed between the phase retardation layer and the linear polarizing layer.

3. The display panel according to claim 2, wherein the linear polarizing layer is located on a side of the phase retardation layer away from the light emitting device layer.

4. The display panel according to claim 1, wherein the thin film transistor array layer comprises an inorganic stacked layer and thin film transistors, the display panel is further provided with an organic stacked layer on the inorganic stacked layer, and the black barrier walls are located on the organic stacked layer or within the thin film encapsulation layer.

5. The display panel according to claim 1, wherein the linear polarizing layer comprises linear polarizing units corresponding to the phase retardation units and distributed in an array, and orthographic projections of the linear polarizing units projected on the substrate cover orthographic projections of the phase retardation units projected on the substrate.

6. The display panel according to claim 5, wherein the phase retardation units cover a light emitting area of the light emitting device layer.

7. The display panel according to claim 1, wherein the phase retardation layer is made of an anisotropic organic material.

8. The display panel according to claim 7, wherein the phase retardation layer is made of a liquid crystal material, and alignment layers are disposed on a surface of the phase retardation layer.

9. The display panel according to claim 1, wherein a phase difference of the phase retardation layer is a quarter wavelength.

10. A display panel, comprising:
a substrate;
a thin film transistor array layer, disposed on the substrate;
a light emitting device layer, disposed on the thin film transistor array layer and comprising light emitting devices distributed in an array;
a thin film encapsulation layer, disposed on the light emitting device layer;
a phase retardation layer, disposed within the thin film encapsulation layer, and comprising phase retardation units corresponding to the light emitting devices and distributed in an array; and
a linear polarizing layer disposed within the thin film encapsulation layer,
wherein the phase retardation layer and the linear polarizing layer are mutually stacked, and the display panel is provided with black barrier walls corresponding to gaps between the two adjacent phase retardation units.

11. The display panel according to claim 10, wherein the thin film encapsulation layer comprises inorganic layers and an organic layer which are mutually stacked, and the phase retardation layer and the linear polarizing layer are located between the inorganic layer and the organic layer which are adjacent to each other, or the inorganic layers and/or the organic layer are disposed between the phase retardation layer and the linear polarizing layer.

12. The display panel according to claim 11, wherein the linear polarizing layer is located on a side of the phase retardation layer away from the light emitting device layer.

13. The display panel according to claim 10, wherein the thin film transistor array layer comprises an inorganic stacked layer and thin film transistors, the display panel is further provided with an organic stacked layer on the inorganic stacked layer, and the black barrier walls are located on the organic stacked layer or within the thin film encapsulation layer.

14. The display panel according to claim 10, wherein the linear polarizing layer comprises linear polarizing units corresponding to the phase retardation units and distributed in an array, and orthographic projections of the linear polarizing units projected on the substrate cover orthographic projections of the phase retardation units projected on the substrate.

15. The display panel according to claim 14, wherein the phase retardation units cover a light emitting area of the light emitting device layer.

16. The display panel according to claim 10, wherein the phase retardation layer is made of an anisotropic organic material.

17. The display panel according to claim 16, wherein the phase retardation layer is made of a liquid crystal material, and alignment layers are disposed on a surface of the phase retardation layer.

18. The display panel according to claim 10, wherein a phase difference of the phase retardation layer is a quarter wavelength.

* * * * *